(12) United States Patent
Lin et al.

(10) Patent No.: US 6,555,903 B2
(45) Date of Patent: Apr. 29, 2003

(54) PACKAGE STRUCTURE OF HYBRID DEVICE IN OPTICAL SIGNAL TRANSMITTER

(75) Inventors: Yun-Sen Lin, Taipei (TW); Chang-Cherng Wu, Hsinchu (TW); Chao-Fang Li, Hsinchu Hsien (TW); Meng-Nan Ho, Chia Yi Hsien (TW)

(73) Assignee: TrueLight Corporation (TW)

( * ) Notice: Subject to any disclaimer, the term of this patent is extended or adjusted under 35 U.S.C. 154(b) by 153 days.

(21) Appl. No.: 09/739,916

(22) Filed: Dec. 19, 2000

(65) Prior Publication Data

US 2002/0076169 A1 Jun. 20, 2002

(51) Int. Cl.[7] ............................................... H01L 23/04
(52) U.S. Cl. .................. 257/698; 257/699; 257/708; 369/112.1; 369/121
(58) Field of Search .......................... 257/698, 699, 257/708; 369/112.1, 121

(56) References Cited

U.S. PATENT DOCUMENTS

| | | | |
|---|---|---|---|
| 5,361,244 A | * 11/1994 | Nakamura et al. | 369/44.12 |
| 5,374,819 A | * 12/1994 | Kim et al. | 250/201.5 |
| 5,581,523 A | * 12/1996 | Seki et al. | 369/112.12 |
| 6,034,424 A | * 3/2000 | Fujimura et al. | 257/433 |
| 6,163,556 A | * 12/2000 | Oskarsson | 372/101 |

* cited by examiner

Primary Examiner—Allan R. Wilson
(74) Attorney, Agent, or Firm—Baker Botts LLP

(57) ABSTRACT

A package structure of a hybrid device in an optical signal transmitter comprises an assembly of a surface emitting laser (SEL), photodiodes, an IC and a passive device, and its application. The package structure further comprises a submount to reduce parasitic capacitance and increase coupling efficiency of the device to the optical fiber, and an electric connect region is formed on the submount to shorten the length of wire and improve the yield. A combination of the SEL and the pair of photodiodes can further applies on a duplexer of single optical fiber.

8 Claims, 6 Drawing Sheets

US 6,555,903 B2

PACKAGE STRUCTURE OF HYBRID DEVICE IN OPTICAL SIGNAL TRANSMITTER

FIELD OF THE INVENTION

The present invention relates to a package structure of hybrid device in optical signal transmitter, and more particularly to a high yield and low cost package structure comprising an assembly of a surface emitting laser, a photodiode, an IC, and a passive device. The package structure can be applied on a duplexer (ping pong device) of single optical fiber.

BACKGROUND OF THE INVENTION

In recent years, surface emitting lasers (SEL) are commonly used in optical fiber communication. FIG. 1A and FIG. 1B are shown a package structure of SEL module in accordance with the prior art. Typically, a metal header 1 is used to carry SEL 2, and a photodiode 3 is disposed beside the SEL 2. A package assembly 4 packages the SEL 2 and the photodiode 3. However, just one photodiode collects less optical power as shown in FIG. 1A. A high cost fabrication method in accordance with the prior art as shown in FIG. 1B easily causes signal distortion because of the SEL module distribution. As shown in FIG. 1C, in a package structure in accordance with the prior art, a photodiode 3 and an IC 4 is supported with a metal header 1, and a wire 5 connects the photodiode 3 and the IC 4. Since the height of the photodiode 3 and IC 4 is not the same, the wire is easy to tumble and thereby reduces the yield. Further, as shown in FIG. 1D, in a photodiode package structure in accordance with the prior art, a photodiode 3, an IC 4 and a passive device 6 is supported with a metal header 1, wherein the passive device is used with a high cost RF capacitor.

SUMMARY OF THE INVENTION

Therefore, an object of the present invention is to provide a package structure of hybrid device in optical signal transmitter, which can improve optical power collection and prevent linear distortion.

Another object of the present invention is to provide a package structure of hybrid device in optical signal transmitter, which can improve the yield and reduce cost.

The present invention provides a package structure of hybrid device in optical signal transmitter, comprising a metal header; a plurality of metal rods disposed on the metal header; a submount insulatively disposed on the metal header; a surface emitting laser disposed on the submount and coupled to the metal rods; a pair of photodiodes disposed on the submount and coupled to the metal rods; and a package assembly disposed on the submount, and packaging the surface emitting laser and the photodiodes, wherein portion of laser light from the surface emitting laser is reflected to the photodiodes.

The present invention also provides a package structure of hybrid device in optical signal transmitter, comprising a metal header; a plurality of metal rods disposed on the metal header; a submount insulatively disposed on the metal header; an integrated circuit (IC) disposed on the submount and coupled to the IC; and a passive device disposed on the submount.

DETAILED DESCRIPTION OF THE PREFERRED EMBODIMENT

[First Embodiment]

Figure 1:
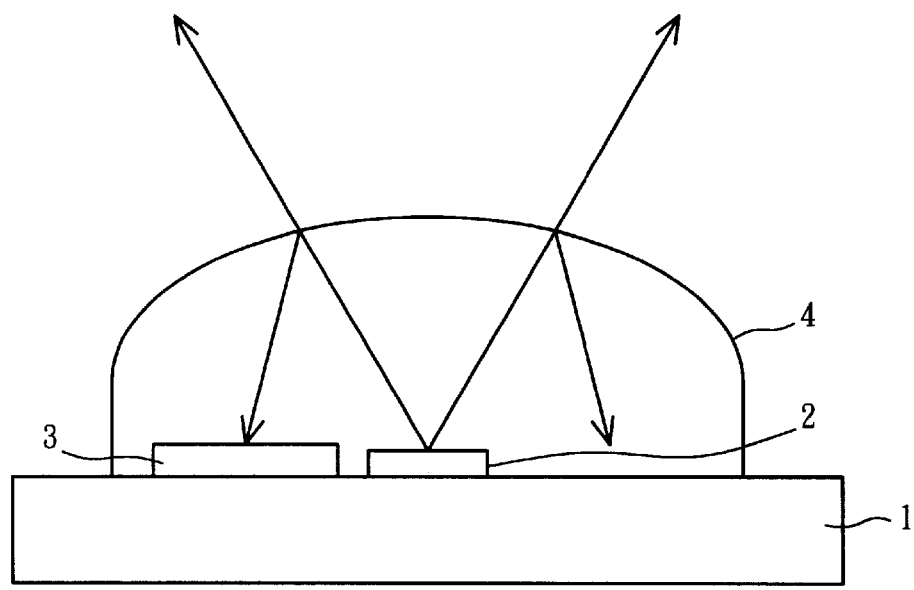
FIG. 1A shows a schematic view of collecting less optical power by using one photodiode in accordance with the prior art.
FIG. 1B shows a schematic view of generating liner distortion of the signal by using one photodiode in accordance with the prior art.
FIG. 1C shows a schematic view of a run-down wire, which results in reducing the yield in accordance with the prior art.
FIG. 1D shows a schematic view of using high cost RF capacitor in accordance with the prior art.
Figure 1:
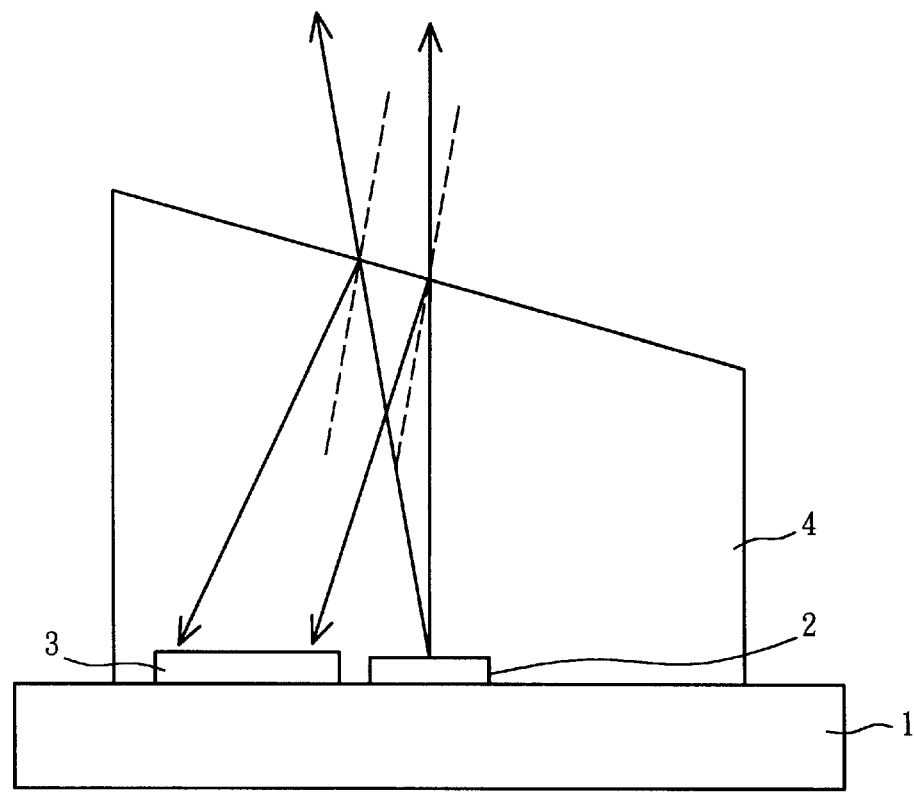
Figure 1:
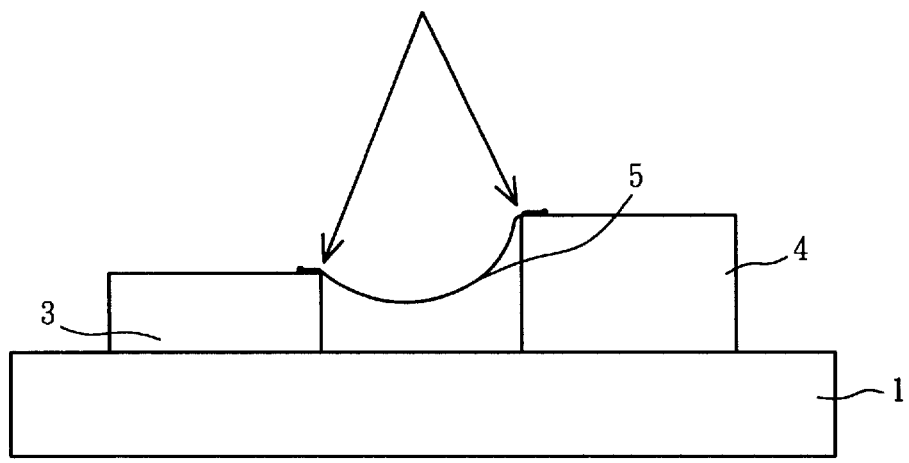
Figure 1:
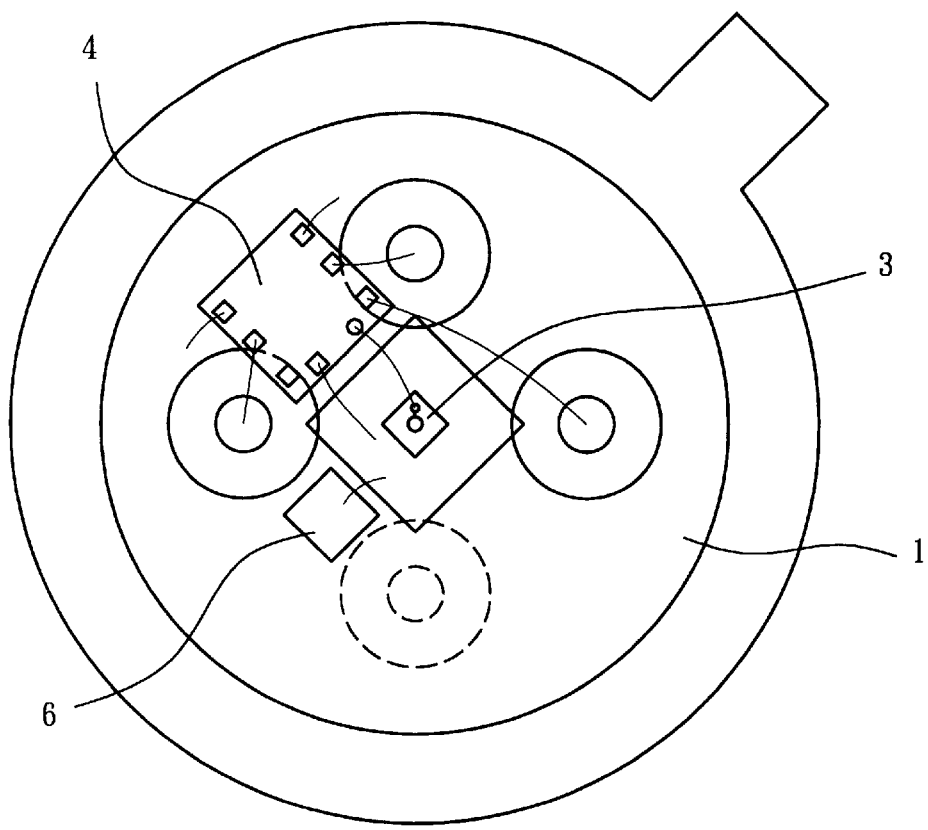
Figure 2:
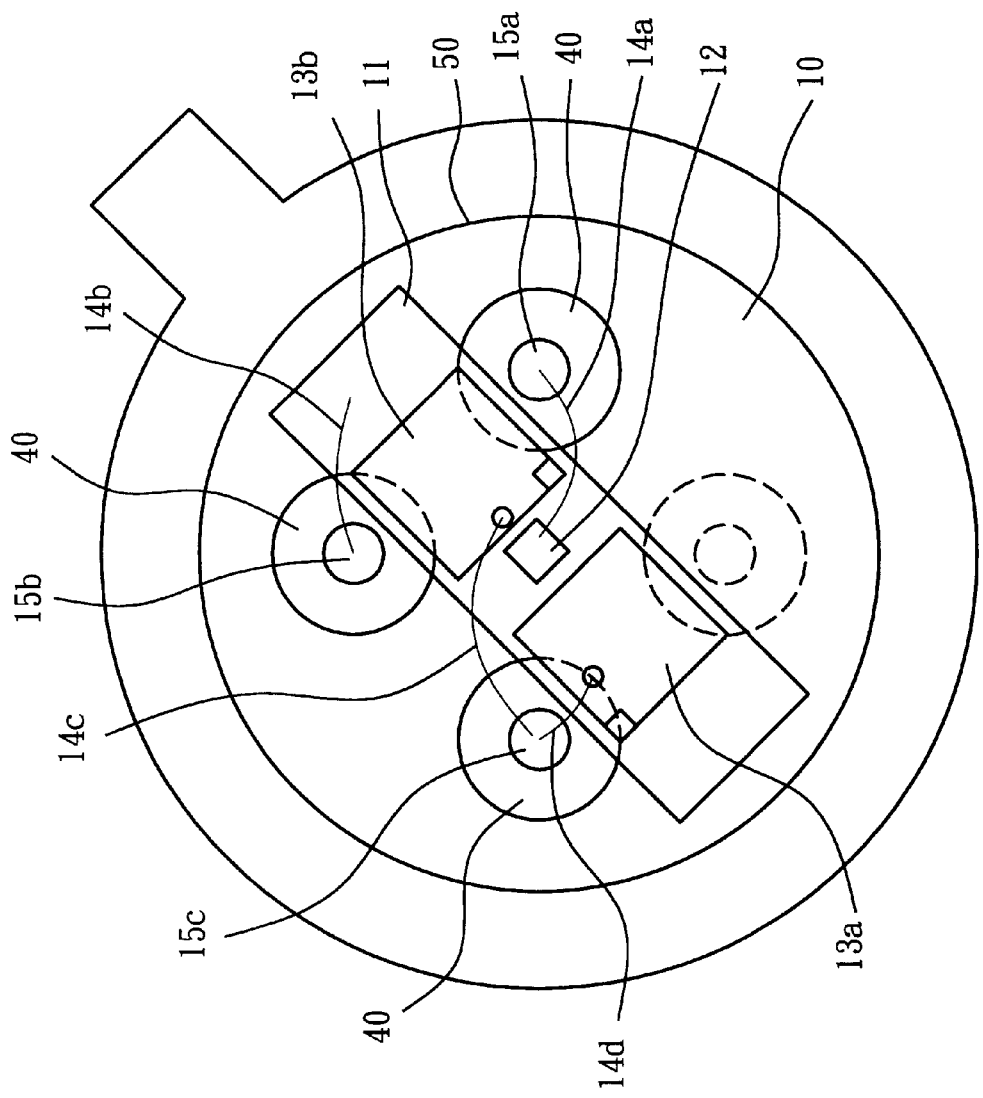
FIG. 2 shows a schematic view of package structure of the first embodiment in accordance with the present invention.

A package structure of hybrid device in optical signal transmitter comprises a metal header 10, as shown in FIG. 2. There are at least three electric connecting metal rods, e.g. first metal rod 15a, second metal rod 15b and third metal rod 15c, on the metal header 10. An insulator 40 disposed between the metal rods and the metal header 10 insulates the metal header 10. A submount 11 is insulatively disposed on the metal header 10. A surface emitting laser (SEL) 12 is disposed on the submount 11. A pair of photodiodes 13a and 13b is disposed on the submount 11 and on both sides of the SEL 12. Four wires are used to electrically connect the metal rod and SEL 12, the metal rod and photodiode 13, and an external circuit (not shown) to form an electric channel. The four wires are a first wire 14a electric connected the first metal rod 15a and the SEL 12, a second wire 14b electric connected the second metal rod 15b and the submount 11, and a third wire 14c and a forth wire 14d electric connected the third metal rod 15c and photodiodes 13b and 13a together. A package assembly 50, generally constructed from a metal cap with a plate glass or a lens glass, is disposed on the metal header to package the SEL 12 and the pair of the photodiodes 13a and 13b. The package assembly 50 reflects portion of light from the SEL 12 to the photodiodes 13a and 13b.

In the first embodiment of the present invention, the first metal rod 15a, the first wire 14a, the SEL 12, the submount 11, the fourth wire 14d, the second metal rod 15b, and the external circuit form an electric channel. The third metal rod 15c, the second wire 14b, the photodiode 12a, the submount 11, the fourth wire 14d, the second metal rod 15b, and the external circuit form an electric channel. The third metal rod 15c, the fourth wire 14c, the photodiode 12b, the submount 11, the fourth wire 14d, the second metal rod 15b, and the external circuit form an electric channel.

In the first embodiment of the present invention, the submount 11 composed of an insulator is used to reduce parasitic capacitor. Gold can be gilt on the submount 11 to form an electric connecting channel. The co-electrode of the SEL 12 and the photodiodes 13a and 13b is electric connected to the electric connecting channel. The fourth wire 14d is electric connected to the electric connecting channel and the second metal rod 15b. The package structure shortens the wire length and increases the package area of the wire, and therefore improves the yield.

[Second Embodiment]

Figure 3:
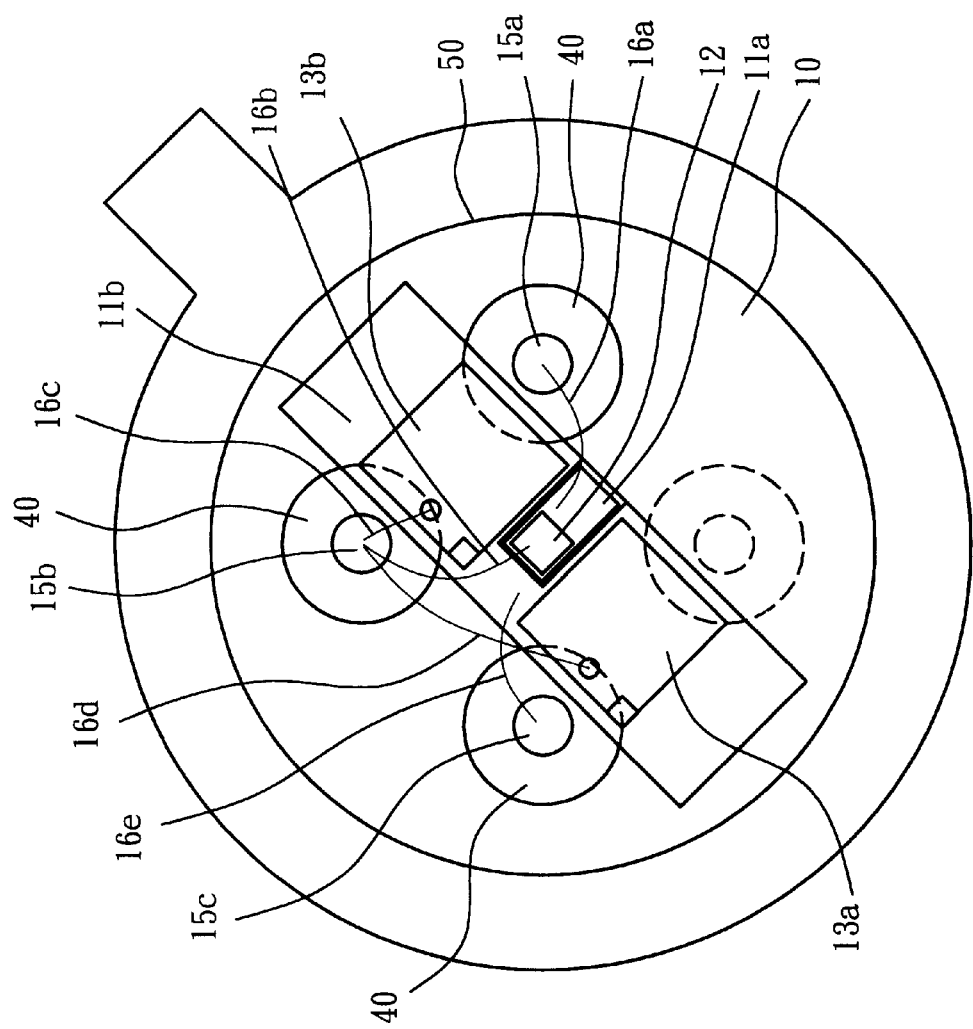
FIG. 3 shows a schematic view of package structure of the second embodiment in accordance with the present invention.

A package structure of hybrid device in optical signal transmitter comprises a metal header 10, as shown in FIG. 3. There are at least three electric connecting metal rods, e.g. first metal rod 15a, second metal rod 15b and third metal rod 15c, on the metal header 10. An insulator 40 disposed between the metal rods and the metal header 10 insulates the metal header 10. A submount 11 is insulatively disposed on the metal header 10 to form two electric connect regions, wherein the electric connect regions are SEL electric connect region 11a and photodiode electric connect region 11b. A SEL 12 is disposed on the submount 11. A pair of photodiodes 13a and 13b is disposed on the submount 11 and on the both sides of the SEL 12. Five wires are used to electrically connect the metal rod and SEL 12, the metal rod and photodiode 13, and an external circuit (not shown) to form an electric channel. The five wires are a first wire 16a electric connected the first metal rod 15a and the SEL electric connect region 11a, a second wire 16b electric connected the second metal rod 15b and SEL 12, a third wire 16c electric connected the second metal rod 15b and photodiode 13b, a fourth wire 16d electric connected the second metal rod 15b and photodiode 13a, and a fifth wire 16e electric connected the third metal rod 15c and photodiode electric connect region 11b, respectively. A package assembly 50, generally constructed from a metal cap with a plate glass or a lens glass, is disposed on the metal header to package the SEL 12 and the photodiodes 13a and 13b. The package assembly 50 reflects portion of light from the SEL 12 to the photodiodes 13a and 13b.

In the second embodiment of the present invention, the first metal rod 15a, the first wire 16a, the SEL connect region 11a, the SEL 12, the second wire 16b, the second metal rod 15b, and external circuit form an electric channel. The second metal rod 15b, the third wire 16c, the photodiode 13b, the photodiode electric connect region 11b, the fifth wire 16e, the third metal rod 15c, and the external circuit form an electric channel. The second metal rod 15b, the fourth wire 16d, the photodiode 13a, the photodiode connect region 11b, the fifth wire 16e, the third metal rod 15c, and the external circuit form an electric channel. The second metal rod 15b, the fourth wire 16d, the photodiode 13a, the photodiode electric connect region 11b, the fifth wire, the third metal rod 15c, and the external circuit form an electric channel.

In the second embodiment of the present invention, the submount 11 composed of an insulator is used to reduce parasitic capacitor. Furthermore, two electric connect regions, i.e. SEL electric connect region 11a and photodiode electric connect region 11b, are formed on the submount 11. Gold can be gilt on the SEL electric connect region 11a and photodiode electric connect region 11b to form its electric connect region, respectively. For example, a co-electrode of the pair of photodiodes is electric connected to the electric connect channel of the electric connect region through the photodiodes. Only one wire, fifth wire 16e, is electric connected to the third metal rod 15c. The package structure shortens the wire length and increases the package area of the wire, and therefore improves the yield.

In the first and second embodiments, the submount 11 is composed of insulator. The thinkness of the submount 11 can be changed to increase couple efficient of the device to optical fiber.

In the first and second embodiments, the SEL 12 comprises a surface emitting semiconductor laser, such as vertical cavity surface emitting laser (VCSEL).

In the first and second embodiments, a high yield and low cost package structure comprises a SEL and a pair of photodiodes on both sides of the SEL. The photodiodes can collect more optical power to generate more photocurrent, and prevent photocurrent response distortion.

In the first and second embodiments, a high yield and low cost package structure comprises a SEL and a pair of photodiodes on both sides of the SEL. The package structure can be applied on a duplexer of single optical fiber. The manufacture cost is lower than a duplexer of two-optical fiber.

[Third Embodiment]

Figure 4:
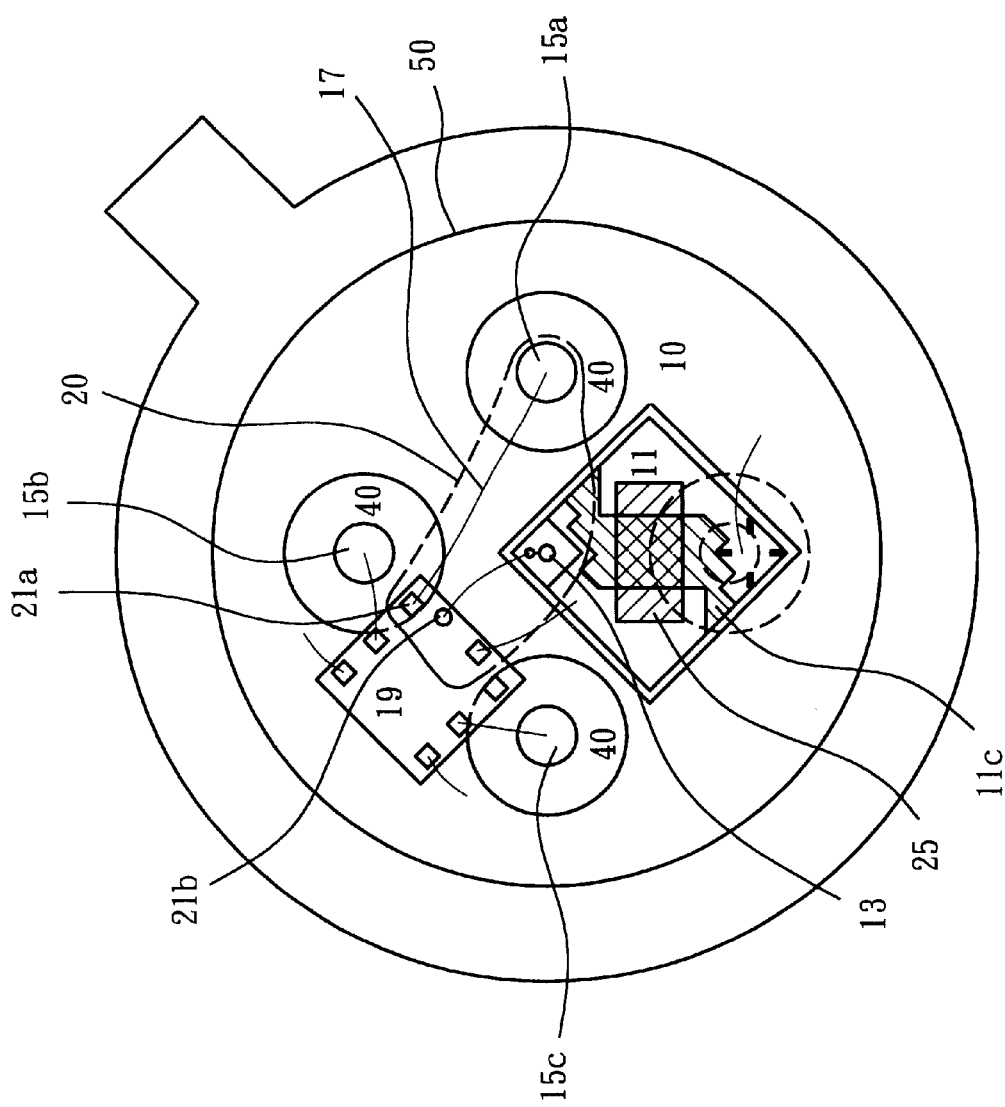
FIG. 4 shows a schematic view of package structure of the third embodiment in accordance with the present invention.

A package structure of hybrid device in optical signal receiver comprises a metal header 10, as shown in FIG. 4. There are at least three electric connecting metal rods, e.g. first metal rod 15a, second metal rod 15b and third metal rod 15c, on the metal header 10. An insulator 40 disposed between the metal rods and the metal header 10 insulates the metal header 10. A submount 11 is insulatively disposed on the metal header 10 to form two regions failing to connect each other.

In the third embodiment of the present invention, the submount 11 composed of an insulator, such as silicon, is used to reduce parasitic capacitor. Gold can be gilt on the surface of the submount 11, and then an insulating region 11c is formed as shown in FIG. 4. The insulating region makes two regions failing to connect each other on the submount 11.

In the third embodiment of the present invention, when the submount is composed of insulator and two regions failing to connect each other are formed, the passive device 25 disposed on the submount 11 can use low cost SMD capacitor.

[Fourth Embodiment]

Figure 5:
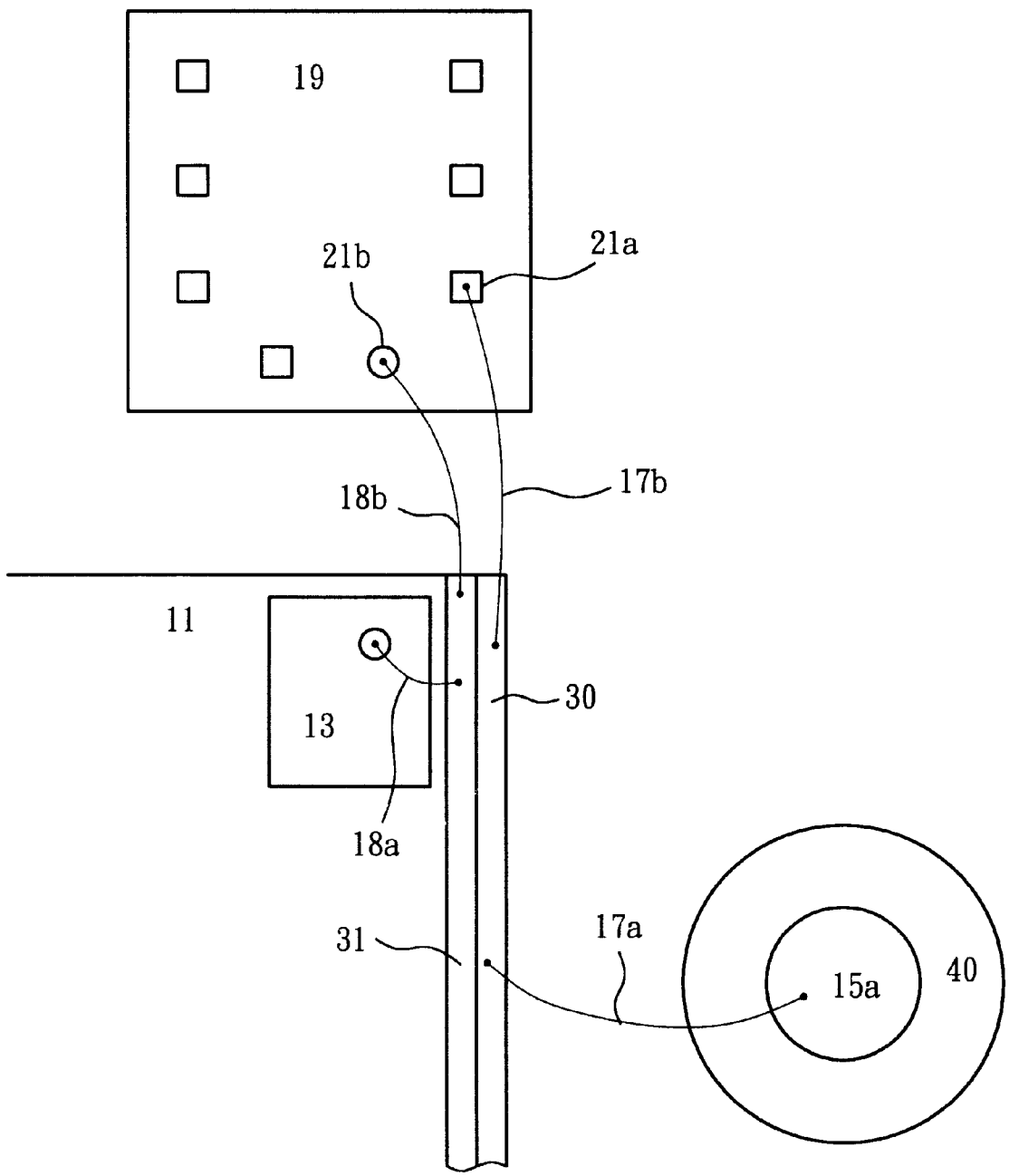
FIG. 5 is a local enlargement in FIG. 4 to show a schematic view of package structure of the fourth embodiment in accordance with the present invention.

FIG. 5 is a local enlargement of the region 20 in FIG. 4. Referring to FIG. 5, in the fourth embodiment of the present invention, a package structure of hybrid device in optical signal receiver is provided. Comparing with the third embodiment, electric connect channels 30 and 31 are further formed on the submount 11. The wire 17 connected the first metal rod 15a and the metal pin of the IC 19 in FIG. 4 is divided into two wires 17a and 17b. The wire 18 connected the photodiode 13 and the metal pin 21b of the IC 19 is divided into two wires 18a and 18b. The wire 17a is connected to the first metal rod 15a and the electric connect channel 30. The wire 17b is connected to electric connect channel 30 and the metal pin 21a of the IC 19. The wire 18a is connected to the photodiode 13 and the electric connect channel 31. The wire 18b is connected to the electric connect channel 31 and the metal pin 21b of the IC 19.

In the fourth embodiment of the present invention, using the submount to form the desired electric connect channel can shorten the wire length, and therefore improve the yield of product.

While the preferred embodiment of the invention has been illustrated and described, it will be appreciated that various changes can be made therein without departing from the spirit and scope of the invention.

What is claimed is:

1. A package structure of a hybrid device in a optical signal transmitter, comprising:

a metal header, wherein the metal header has a first metal rod, a second metal rod, and a third metal rod, and the metal rods are insulated with the metal header by an insulator;

a submount insulator disposed on the metal header, wherein an electric connect region is formed on the submount insulator;

a surface emitting laser disposed on the submount insulator and coupled to the metal rods;

a pair of photodiodes disposed on the submount insulator and coupled to the metal rods, wherein the pair of photodiodes are on both sides of the surface emitting laser, and the photodiodes and the surface emitting laser have the same electric connect region; and a package assembly disposed on the metal header, and packaging the surface emitting laser and the photodiodes, wherein portion of laser light from the surface emitting laser is reflected to the photodiodes, wherein the first metal rod is connected to the surface emitting laser through a first wire, the second metal rod is connected to the submount insulator through a second wire, and the third metal rod is connected to the pair of photodiodes through a third wire and a forth wire, so that the first metal rod, the SEL, the submount insulator and the second metal rod are formed an electric channel with an external circuit, and the second metal rod, the submount insulator, the photodiodes and the third metal rod are formed another electric channel with the external circuit.

2. The structure according to claim 1 wherein the SEL is a vertical cavity surface emitting laser.

3. The structure according to claim 1 wherein the package assembly is a metal cap with a lens.

4. A package structure of a hybrid device in a optical signal receiver, comprising:

a metal header;

a plurality of metal rods disposed on the metal header;

a submount insulator disposed on the metal header;

an integrated circuit (IC) disposed on the metal header and coupled to the plurality of metal rods;

a photodiode disposed on the submount insulator and coupled to the IC;

a passive device disposed on the submount insulator, wherein the passive device is SMD capacitor;

a package assembly to package the photodiode, the IC and the passive device;

two regions failing to connect each other formed on the submount insulator, wherein the passive device is electric connected to the two regions failing to connect each other; and an electric connect region formed on the submount insulator.

5. The structure according to claim 4, wherein the package assembly is a metal cap with a lens or a flat glass window or other formats.

6. A package structure of a hybrid device in a optical signal transmitter, comprising:

a metal header, wherein the metal header has a first metal rod, a second metal rod, and a third metal rod, and the metal rods are insulated with the metal header by an insulator;

a submount insulator disposed on the metal header;

a surface emitting laser disposed on the submount insulator and coupled to the metal rods;

a pair of photodiodes disposed on the submount insulator and coupled to the metal rods, wherein the pair of the photodiodes are on both sides of the surface emitting laser; and a package assembly disposed on the metal header, and packaging the surface emitting laser and the photodiodes, wherein portion of laser light from the surface emitting laser is reflected to the photodiodes, wherein two electric connect regions are formed on the submount insulator, wherein the two electric connect regions respectively are a photodiode electric connect region and a surface emitting laser connect region, wherein the first metal rod is connected to the surface emitting laser electric connect region through a first wire, the second metal rod is connected to the surface emitting laser through a second wire, the second metal rod is connected to the photodiodes through a third wire and a fourth wire, and the third metal rod is connected to the photodiode electric connect region through fifth wire, so that the first metal rod, the SEL, the SEL electric connect region and the second metal rod are formed an electric channel with an external circuit, and the second metal rod, the photodiodes, the photodiode electric connect region and third metal rod are formed another electric channel with the external circuit.

7. The structure according to claim 6, wherein the SEL is a vertical cavity surface emitting laser.

8. The structure according to claim 6, wherein the package assembly is a metal cap with a lens.

* * * * *